United States Patent [19]
Wu

[11] Patent Number: 6,011,286
[45] Date of Patent: Jan. 4, 2000

[54] DOUBLE STAIR-LIKE CAPACITOR STRUCTURE FOR A DRAM CELL

[75] Inventor: Shye-Lin Wu, Hsinchu, Taiwan

[73] Assignees: Texas Instruments; Acer Incorporated, both of Hsinchu, Taiwan

[21] Appl. No.: 08/960,870

[22] Filed: Oct. 31, 1997

[51] Int. Cl.[7] .......................... H01L 27/108; H01L 29/76
[52] U.S. Cl. .......................... 257/309; 257/310; 257/534
[58] Field of Search .................................. 257/306, 310, 257/308, 309, 534

[56] References Cited

U.S. PATENT DOCUMENTS

| | | | |
|---|---|---|---|
| 5,104,821 | 4/1992 | Choi et al. | 275/309 |
| 5,459,345 | 10/1995 | Okudaira et al. | 257/310 |
| 5,796,138 | 8/1998 | Chao | 257/309 |

FOREIGN PATENT DOCUMENTS

| | | | |
|---|---|---|---|
| 1-171261 | 7/1989 | Japan | 257/534 |

OTHER PUBLICATIONS

M. Sakao et al., "A Capacitor–Over–Bit–Line (COB) Cell With a Hemispherical–Grain Storage Node for 64Mb Drams", Apr. 1990, IEEE.

H. Watanabe et al., "A New Cylindrical Capacitor Using Hemispherical Grained Si (HSG–Si) for 256Mb Drams", Apr. 1992, IEEE.

*Primary Examiner*—Donald L. Monin, Jr.
*Attorney, Agent, or Firm*—Harness, Dickey & Pierce, P.L.C.

[57] ABSTRACT

The double-stair-like capacitor formed on a semiconductor substrate includes a first storage node having stair-like structures in cross section view to increase the area of the first storage node. A dielectric layer substantially conformally covers a surface of the first storage node. A second storage node having a surface substantially conformally contacts the dielectric layer.

8 Claims, 7 Drawing Sheets

DOUBLE STAIR-LIKE CAPACITOR STRUCTURE FOR A DRAM CELL

FIELD OF THE INVENTION

The present invention relates to a capacitor for a dynamic random access memory (DRAM) cell and, more specifically, to a method of making a stair-like capacitor for a DRAM cell.

BACKGROUND OF THE INVENTION

A DRAM cell is provided to store a bit of information. Each memory cell typically consists of a storage capacitor and an access transistor. Either the source or drain of the access transistor is connected to one terminal of the capacitor. The other side of the transistor and the transistor gate electrode are connected to external connection lines called a bit line and a word line, respectively. The other terminal of the capacitor is connected to a reference voltage. The formation of a DRAM memory cell comprises the formation of a transistor, a capacitor and contacts to external circuits.

With the advance of the integrated circuits, the requirement of the capacitance of the capacitor is continuously increasing. In order to achieve high packing density of a wafer, the memory cells must be scaled down in size to the sub-micrometer range. As the memory cells decrease in size, the area of the capacitors also decrease, resulting in a reduction of cell capacitance. For very small memory cells, capacitors become very difficult to use reliably. Specifically, as the size of the capacitor decreases, the amount of the charge capable of being stored by the capacitor similarly decreases. This results in the capacitor being very susceptible to α particle interference. Additionally, as the capacitance decreases, the charge held by storage capacitor must be refreshed often.

Prior art approaches for overcoming these problems have resulted in the development of a memory cell with a hemispherical grained silicon (HSG-silicon) storage node. (See for example "A Capacitor-Over-Bit-Line Cell with a Hemispherical Grain Storage Node For 64 Mb Drams", IEDM Tech Dig., Dec. 1990, pp 655–658.) The HSG-silicon is deposited by a low pressure chemical vapor deposition method. Deposition is performed at a temperature of 550 centigrade degrees with He diluted. This memory cell provides large storage capacitance by increasing the effective surface area of a simple storage node. The HSG-silicon storage node can be fabricated by the addition of two process steps, i.e. HSG-silicon deposition and an etch back. Further, in U.S. Pat. No. 5,104,821, Choi teaches a method of forming a capacitor for a DRAM cell. However, the capacitance cannot meet the requirement of future high density DRAM application.

In addition, the present invention uses high etching selectivity among BPSG (boro-phospho silicate glass), PSG (phospho silicate glass), BSG(boro silicate glass), NSG (undoped silicon glass) to form a stair-like resulting structure. The etching rates of the aforesaid materials under HF vapor are proposed by H. Watanabe, et al., "A New Cylindrical Capacitor Using Hemispherical Grained Si (HSG-Si) for 256 Mb DRAMs", 1992, IEEE, 92–259.

SUMMARY OF THE INVENTION

The present invention thus provides capacitors with an enlarged surface area. A dielectric layer is deposited over a substrate. A first conductive layer is formed over the dielectric layer. Subsequently, a stacked layer is formed on the silicon nitride layer. The stacked layer consists of at least three, preferably four, layers with different etching rates under a certain etchant with one another. An etching is used to etch the stacked layer and the conductive layer to define a storage node using a photoresist as a mask. Then, a selective etching is performed to etch the stacked layer in a HF vapor or HF solution. The amount of etching by the etchant of the sub-layers is different due to the different etching rates.

A thin polysilicon layer is then conformlly formed along the surface of the stacked layer and the first conductive layer. Then, an anisotropical etching is carried out to etch the polysilicon layer. The polysilicon layer on the top of the stacked layer is completely removed to expose the top layer of the stacked layer. Next, the stacked layer is removed by diluted HF solution. A portion of the first conductive layer is exposed. After this step, two stair-like structures are formed on the first conductive layer. The stair-like polysilicon structures are used to act as a first storage node of a capacitor. An etching process is performed to remove the dielectric layer. A dielectric layer is deposited along the surface of the first conductive layers and the polysilicon layers. Finally, a conductive layer is deposited over the dielectric layer.

The double-stair-like capacitor formed on a semiconductor substrate includes a first storage node having stair-like structures in cross section view to increase the area of the first storage node. The dielectric layer substantially conformally covers a surface of said first storage node. A second storage node has a surface substantially conformally contacting said dielectric layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The formation of the stair-like capacitor described herein includes many process steps that are well known in the art. For example, the processes of lithography masking and etching are well known in the art and are used extensively herein without a detailed discussion of this well-known technology. In addition, the present invention uses high selectivity etching between at least three stacked layers to form the stair-like capacitor structure. Furthermore, in an preferred embodiment, the high etching selectivity between BPSG, PSG, BSG and NSG is used to form the capacitor.

Figure 1:
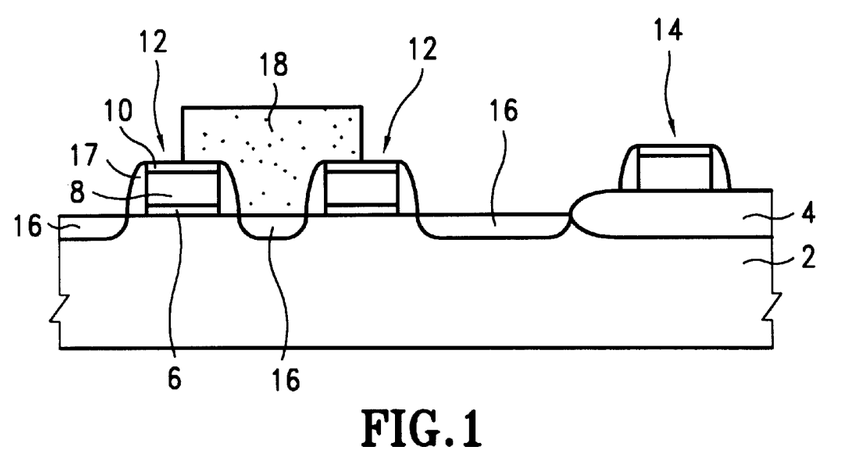
FIG. 1 is a cross-section view of a semiconductor wafer illustrating the step of forming a gate structure on a semiconductor substrate according to the present invention.

Referring to FIG. 1, a single crystal silicon substrate 2 with a <100> crystallographic orientation is provided. A thick field oxide (FOX) region 4 is formed to provide isolation between devices on the substrate 2. The FOX region 4 is created in a conventional manner. For example, the FOX region 4 can be formed via lithography and dry etching steps to etch a silicon nitride-silicon dioxide composition layer. After the photoresist is removed and wet cleaned, thermal oxidation in an oxygen-steam environment is used to grow the FOX region 4 to a thickness of about 3000–8000 angstroms. In addition, a well-known trench isolation technology can be used to replace the FOX 4.

Next, a silicon dioxide layer 6 is created on the top surface of the substrate 2 to serve as the gate oxide for subsequently formed metal oxide silicon field effect transistors (MOSFETs). In one embodiment, the silicon dioxide layer 6 is formed by using an oxygen ambient at a temperature of about 800 to 1100° C. Alternatively, the oxide layer 6 may be formed using any suitable oxide chemical compositions and procedures. In this embodiment, the thickness of the silicon dioxide layer 6 is approximately 30–200 angstroms.

A doped first polysilicon layer 8 is then formed over the FOX region 4 and the silicon dioxide layer 6 using a low pressure chemical vapor deposition (LPCVD) process. In this embodiment, the first polysilicon layer 8 has a thickness of about 500–2000 angstroms. A tungsten silicide layer or cap layer 10 is formed on the first polysilicon layer 8. Next, standard lithography and etching steps are used to form a gate structure 12 and a word line 14. Subsequently, doped ion regions 16 (i.e. the source and the drain) are formed by using well known processes to implant appropriate impurities in those regions. Then a metal layer is formed on the substrate 2, A patterning process and an etching process are used to etch the metal layer to form a bit line 18.

Figure 2:
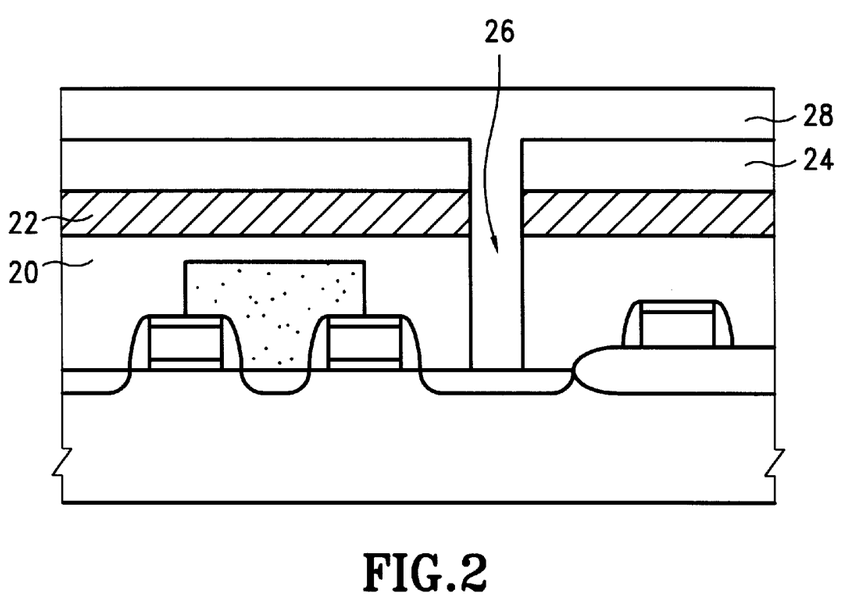
FIG. 2 is a cross-section view of a semiconductor wafer illustrating the step of forming a first dielectric layer, a second dielectric layer, a third dielectric layer and a polysilicon layer over the semiconductor substrate according to the present invention.

Turning next to FIG. 2, a first dielectric layer 18 is formed on the gate structure 12, the word line 14, the bit line 18 and the substrate 2. The first dielectric layer 20 can be formed by using suitable material such as borophosphosilicate glass (BPSG), silicon nitride or oxide. The thickness of the first dielectric layer 20 is about 3000–10000 angstroms. Next, a second dielectric layer 22 composed of oxide is deposited on the first dielectric layer to serve as an etching barrier for a subsequent process. The thickness of the second dielectric layer 22 is about 300–2000 angstroms. A third dielectric layer 24, such as silicon nitride layer or the like, is formed covering the second dielectric layer 22. A contact hole 26 is formed in the first dielectric layer 20, the second dielectric layer 22 and the third dielectric layer 24 by patterning and etching them. The doped ion region 16 is exposed by the contact hole 26.

A first conductive layer 28 is formed over and in the contact hole 24 and on the third dielectric layer 24. The first conductive layer 26 is preferably formed using a conventional LPCVD processing. The thickness of the first conductive layer 26, as measured over the third dielectric layer 24, is optimally 1000–10000 angstroms. The first conductive layer 24 is preferably chosen from doped polysilicon or in-situ doped polysilicon.

Figure 3:
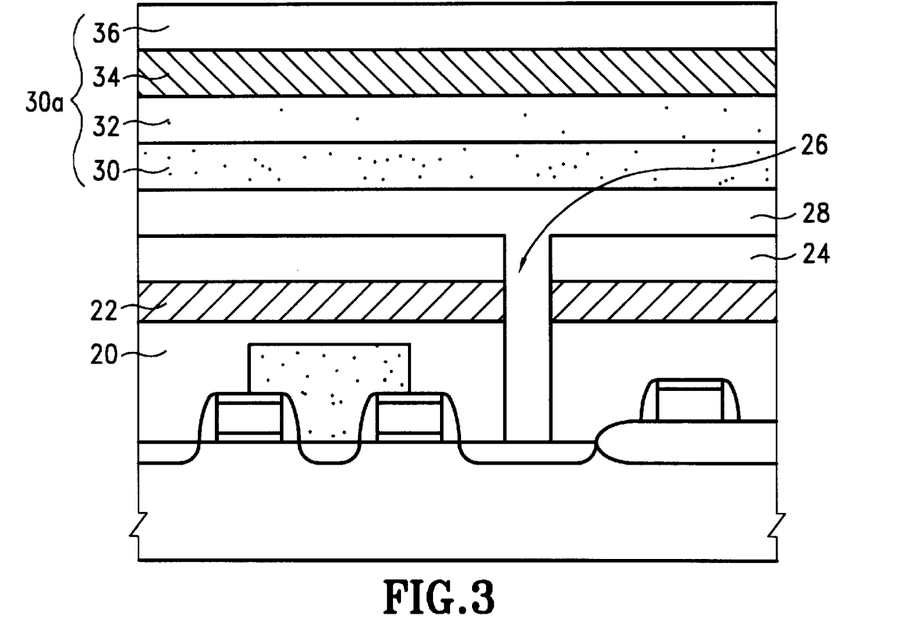
FIG. 3 is a cross-section view of a semiconductor wafer illustrating the step of forming a stacked layer on the polysilicon layer according to the present invention.

Turning now to FIG. 3, a stacked layer 30a is formed on the silicon nitride layer 24. The stacked layer 30a consists of at least three, preferably four, layers with different etching rates under a certain etchant with one another. In a preferred embodiment, the stacked layer includes four sub-layers. A BPSG 30 layer with a first etching rate is formed on the polysilicon layer 28. Then, a PSG layer 32 with a second etching rate is formed on the BPSG layer 30. The third sub-layer is composed of BSG 34 that is formed on the PSG layer 32. The PSG layer 34 has a third etching rate. The fourth sub-layer 36 has a relatively low etching rate to the other three sub-layers. The fourth sub-layer is formed of NSG (undoped silicon glass).

It should be noted that the sub-layer with the lowest etching rate must be formed on top of the stacked layer for acting as a mask for a subsequent process. In this case, the BPSG 30 exhibits the highest etching rate in the four sub-layers. Further, the third etching rate of the BSG 34 is higher than the second etching rate of the PSG 32. The sequence of forming sub-layers that are under the sub-layer with the highest etching rate can be changed. Namely, the first, second and third sub-layers of the stacked layer are selected from a group of BPSG (boro-phospho silicate glass), PSG (phospho-silicate glass) and BSG (boro-silicate glass).

Figure 4:
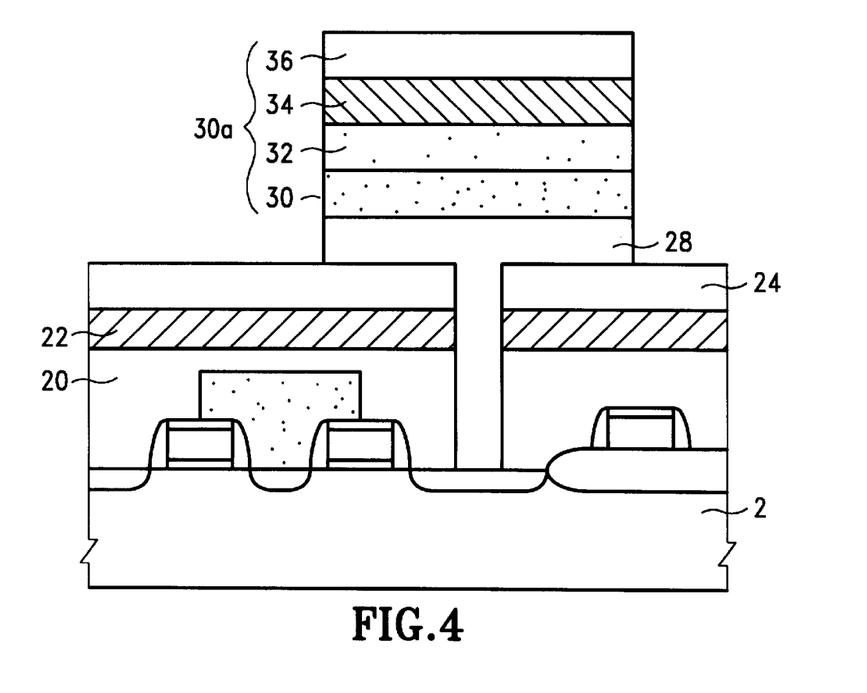
FIG. 4 is a cross-section view of a semiconductor wafer illustrating the step of defining a storage node according to the present invention.
Figure 5:
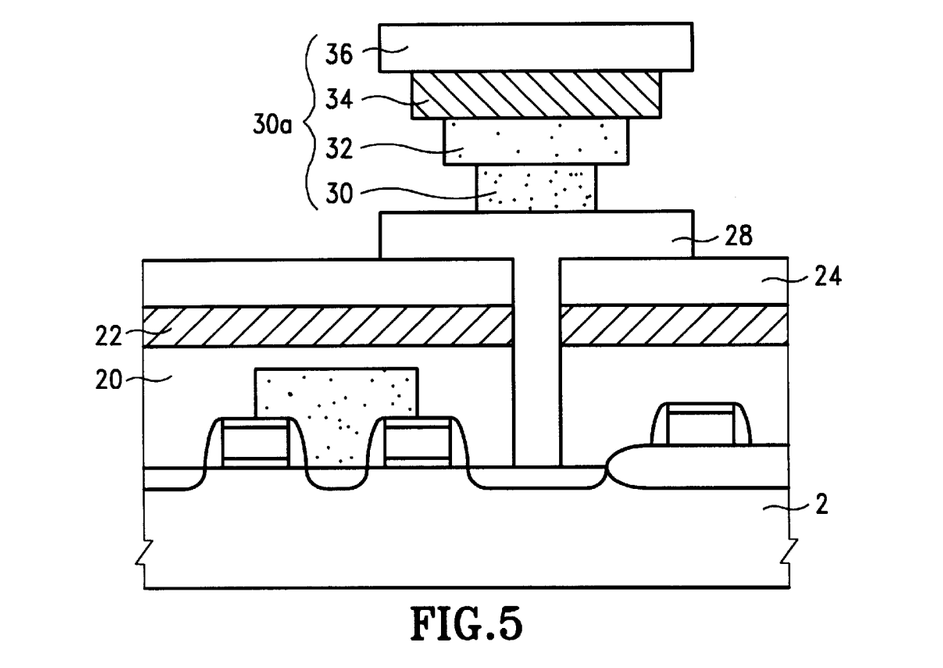
FIG. 5 is a cross-section view of a semiconductor wafer illustrating the step of etching the stacked layer to form according to the present invention.

Turning next to FIG. 4, an etching is used to etch the stacked layer 30a, and the polysilicon layer 28 to define a storage node using a photoresist as a mask. Then, a selective etching is performed to etch the stacked layer 30a in a low pressure HF vapor or HF solution, as shown in FIG. 5. The amount of etching by the etchant of the sub-layers is different due to the different etching rates. The BPSG layer 30 is etched sufficiently than the other sub-layers. The NSG layer 36 is relatively slightly etched by the etchant only. Thus, others sub-layers are covered by the NSG layer 36.

Figure 6:
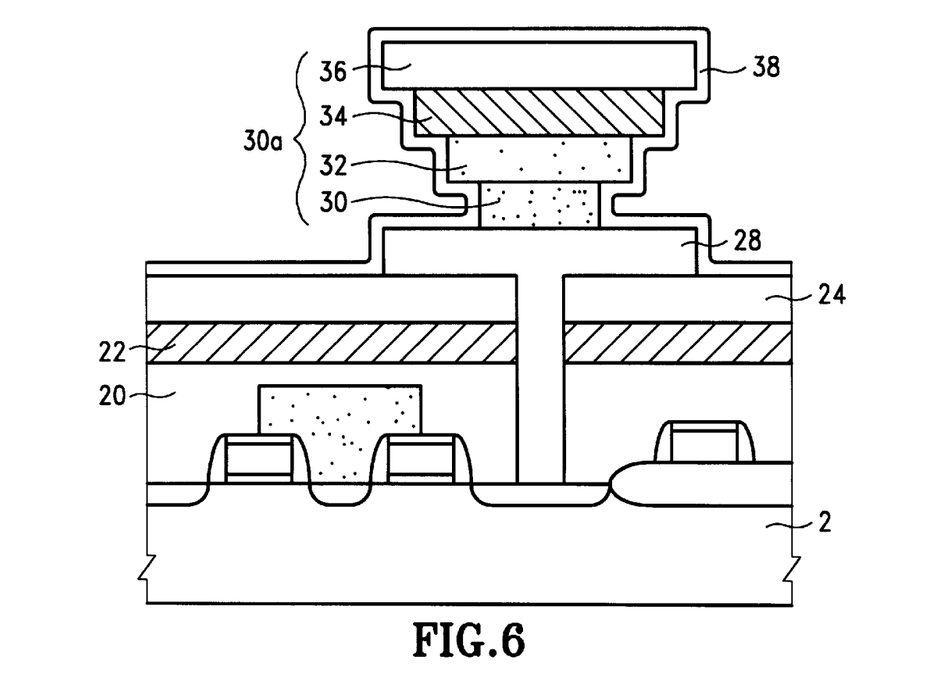
FIG. 6 is a cross-section view of a semiconductor wafer illustrating the step of forming a thin polysilicon layer along the surface of the stacked layer according to the present invention.
Figure 7:
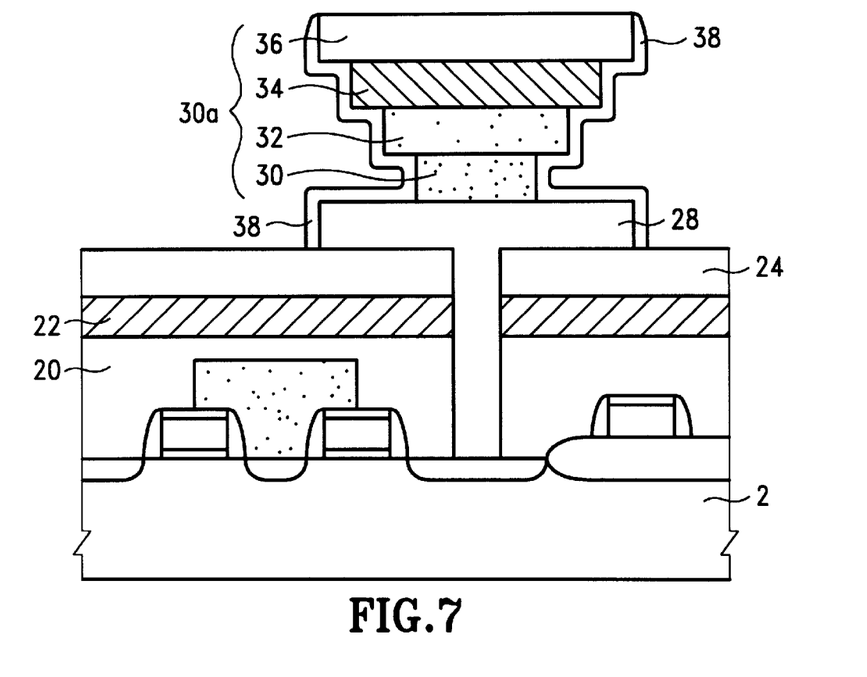
FIG. 7 is a cross-section view of a semiconductor wafer illustrating the step of etching the stacked layer according to the present invention.

As seen in FIG. 6, a thin polysilicon layer 38 then conformally covers the surface of the stacked layer 30a and the polysilicon layer 28. The polysilicon layer 38 is chosen from doped polysilicon or in-situ doped polysilicon. Then, as shown in FIG. 7, an anisotropical etching is carried out to etch the polysilicon layer 38. The polysilicon layer 38 on top of the NSG layer 36 is completely removed to expose the NSG layer 36. The polysilicon layer 38 covered by the NSG layer 36 still remains on the stacked layer 30a and the polysilicon layer 28. Further, portions of the polysilicon layer 38 on the silicon nitride layer 24 are also removed. This is because the portions of the polysilicon layer 38 are not covered by the NSG layer 36. Preferably, the etchant to etch the polysilicon layer 38 is chosen from the group of $SiCl_4/Cl_2$, $BCL_3/Cl_2$, $HBr/Cl_2/O_2$, $HBr/O_2$, $HBr/O_2$, $Br_2/SF_6$ or $SF_6$.

Figure 8:
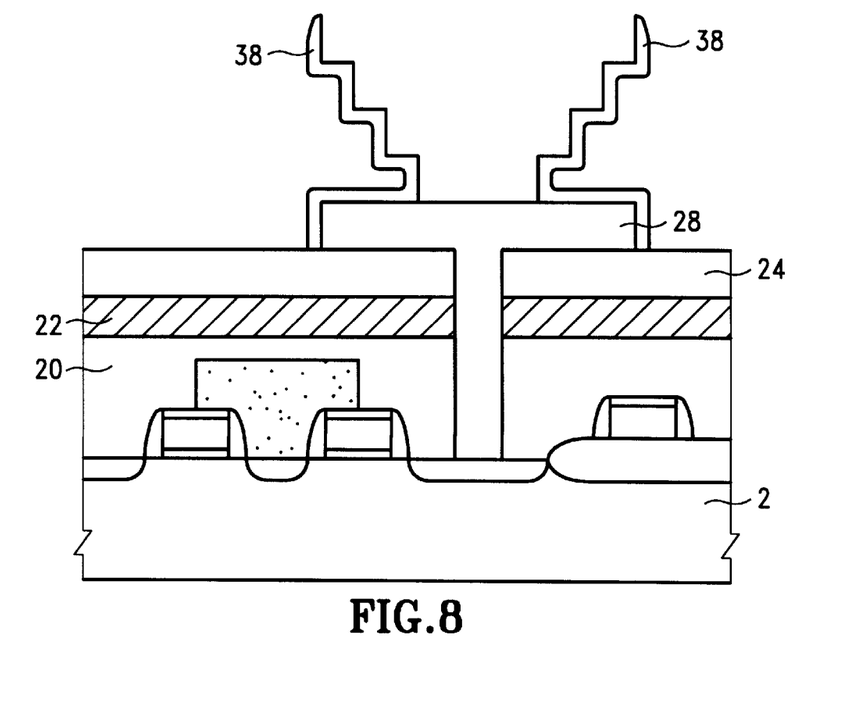
FIG. 8 is a cross-section view of a semiconductor wafer illustrating the step of removing the stacked layer according to the present invention.

Next, as seen in FIG. 8, the stacked layer 30a is removed by a diluted HF solution or HF vapor. A portion of the polysilicon layer 28 is exposed. After this step, two stair-like polysilicon structures are formed on the polysilicon layer 28. The stair-like polysilicon structures are used to act as a first storage node of a capacitor.

Figure 9:
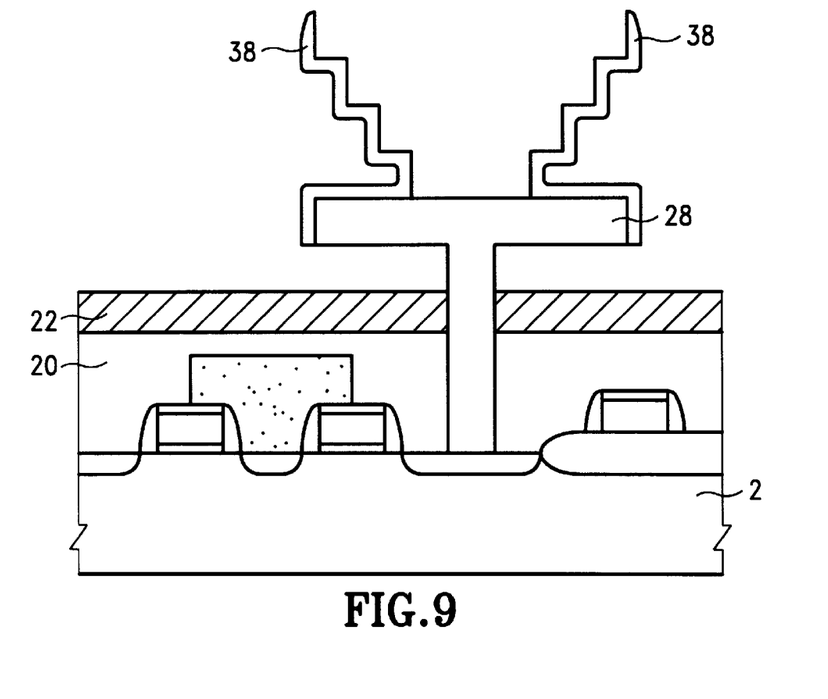
FIG. 9 is a cross-section view of a semiconductor wafer illustrating the step of removing the third dielectric layer according to the present invention.

As shown in FIG. 9, an etching process is performed to remove the silicon nitride layer 24 by using the hot phosphorus solution as an etchant to increase an extra area for the storage node. The oxide layer 22 is used to act as an etching barrier.

Figure 10:
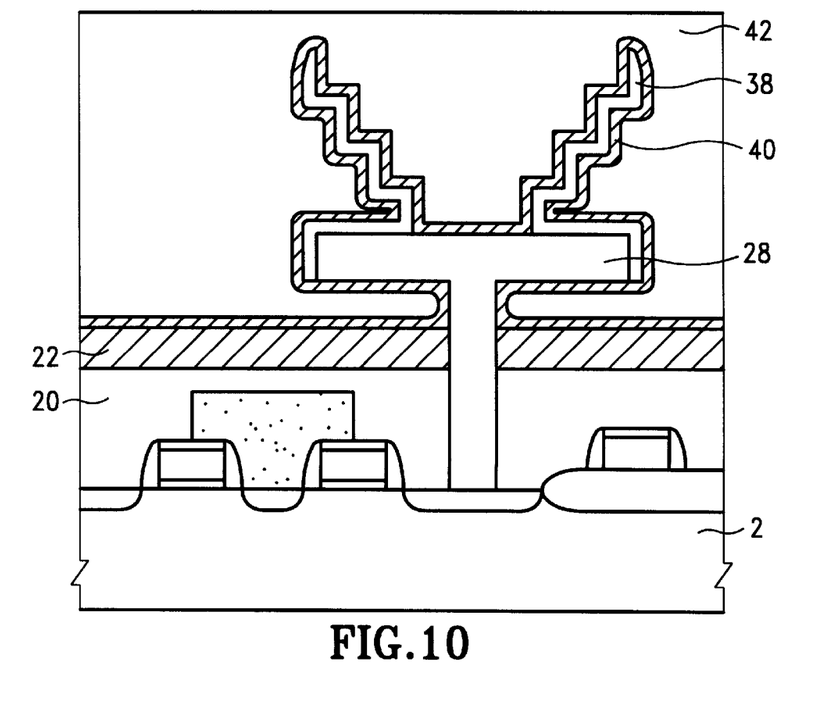
FIG. 10 is a cross-section view of a semiconductor wafer illustrating the step of forming a thin dielectric film along the surface of the polysilicon layer and a conductive layer according to the present invention.

Referring to FIG. 10, a dielectric layer 40 is deposited along the surface of the silicon oxide layer 22, the polysilicon layers 28 and the polysilicon layers 38. The dielectric layer 40 is preferably formed of either a double film of silicon nitride/silicon oxide film, a triple film of silicon oxide/silicon nitride/silicon oxide, or any other high dielectric film such as tantalum pentoxide ($Ta_2O_5$), BST or PZT.

Finally, as is shown in FIG. 10, a conductive layer 42 is deposited using a conventional LPCVD process over the dielectric layer 40. The conductive layer 42 provides a second storage electrode and is formed of doped polysilicon, in-situ doped polysilicon, aluminum, copper, tungsten or titanium. Thus, a semiconductor capacitor comprises a polysilicon plate 28 and a stair-like structure composed of polysilicon as the first storage node in cross section view to increase the area of the first storage node. A dielectric layer 40 substantially conformally covers the surface of the first storage node. A conductive layer 42 is its second storage node which is formed on the dielectric layer. The double-stair-like capacitor formed on a semiconductor substrate includes a first storage node having stair-like structures in cross section view to increase the area of the first storage node. The dielectric layer substantially conformally covers a surface of said first storage node. A second storage node has a surface substantially conformally contacting said dielectric layer. The first storage node 28 has stair-like structure 38 in cross-section view to increase the area of the first storage node. Namely, the first storage node includes a first conductive structure 28 formed over the semiconductor substrate 2. The stair-like strucuters 38 are formed on an upper surface of the first conductive structure 28 and extend upright away from the substrate 2. The stair-like structures are second conductive structures and include a plurality of vertical pillars and a plurality of horizontal fins. Two of the vertical pillars are respectively connected to the first conductive structure 28. The plurality of vertical pillars and the plurality of horizontal fins are connected and interchanged repeatedly.

Figure 11:
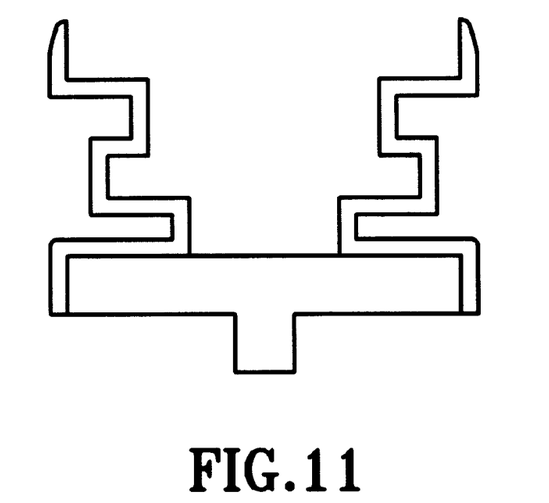
FIGS. 11 to 15 are the variation of the storage node according to the present invention.
Figure 12:
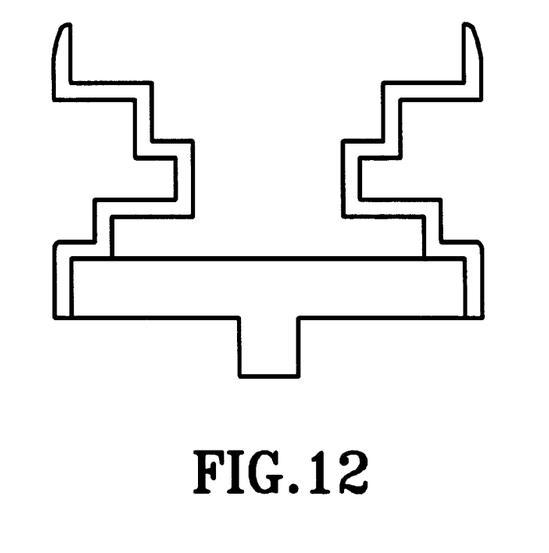
Figure 13:
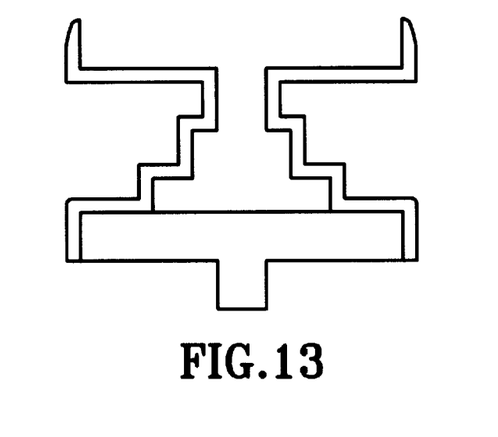
Figure 14:
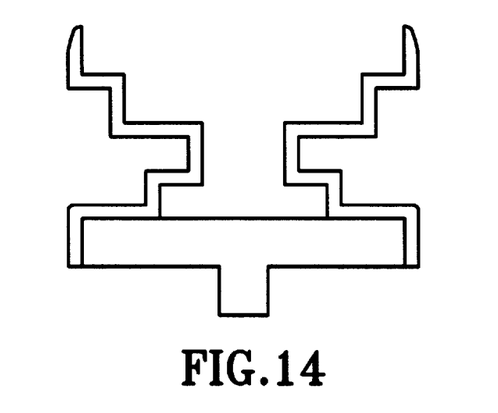
Figure 15:
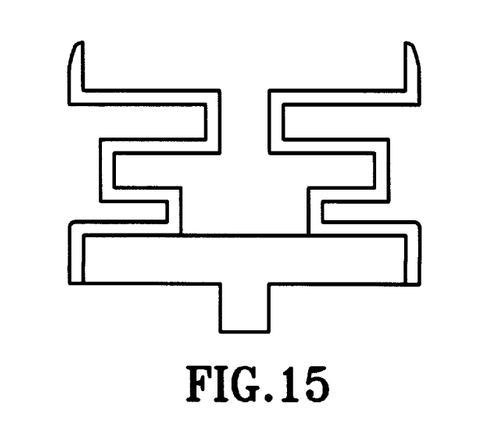

As aforementioned, the sub-layer having the lowest etching rate must be formed on top of the stacked layer 30a. The other underlying layers can be formed in any sequence. For example, the stacked layer from the top to bottom consists of NSG, PSG, BSG and BPSG. Then the storage node is formed as shown in FIG. 11. The storage node can also be formed as FIG. 12 by using a stacked layer of BSG, BPSG, PSG and NSG. Other variations can be formed by interchanging the positions of the sub-layer. Please see FIGS. 13–15.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures.

While the preferred embodiment of the invention has been illustrated and described, it will be appreciated that various changes can be made therein without departing from the spirit and scope of the invention.

What is claimed is:

1. A double-stair-like capacitor formed on a semiconductor substrate, said capacitor comprising:

a first storage node having stair-like structures in cross-section view to increase the area of said first storage node, wherein said first storage node includes a first conductive structure formed over said semiconductor substrate, said stair-like structures being formed on an upper surface of said first conductive structure, said stair-like structures being second conductive structures and extending upright away from said substrate, wherein said stair-like structures include a plurality of vertical pillars and a plurality of horizontal fins, two of said vertical pillars being respectively connect to said first conductive structure, said plurality of vertical pillars and said plurality of horizontal fins being connected and interchanged repeatedly;

a dielectric layer substantially conformally covering a surface of said first storage node; and a second storage node substantially conformally contacting said dielectric layer.

2. The capacitor of claim 1, wherein said dielectric layer is formed of $Ta_2O_5$.

3. The capacitor of claim 1, wherein said dielectric layer is formed of BST.

4. The capacitor of claim 1, wherein said dielectric layer is formed of PZT.

5. The capacitor of claim 1, wherein said dielectric layer is formed of a triple film of silicon oxide, silicon nitride and silicon nitride oxide.

6. The capacitor of claim 1, wherein said dielectric layer is formed of a double film of silicon nitride and silicon oxide.

7. The capacitor of claim 1, wherein said first storage node comprises polysilicon.

8. The capacitor of claim 1, wherein said second storage node comprises polysilicon.

* * * * *